United States Patent
Iozsef et al.

(10) Patent No.: US 7,915,938 B2
(45) Date of Patent: Mar. 29, 2011

(54) MULTI-CHANNEL DIGITAL PULSE WIDTH MODULATOR (DPWM)

(75) Inventors: Eric Iozsef, Toronto (CA); Irv Lustigman, St-Laurent (CA); Abdelkarim Gadiri, Etobicoke (CA)

(73) Assignee: Exar Corporation, Fremont, CA (US)

( * ) Notice: Subject to any disclaimer, the term of this patent is extended or adjusted under 35 U.S.C. 154(b) by 30 days.

(21) Appl. No.: 12/608,186

(22) Filed: Oct. 29, 2009

(65) Prior Publication Data
US 2010/0117752 A1 May 13, 2010

Related U.S. Application Data

(60) Provisional application No. 61/110,244, filed on Oct. 31, 2008.

(51) Int. Cl.
| | |
|---|---|
| H02M 1/12 | (2006.01) |
| H02M 1/14 | (2006.01) |
| H02M 3/325 | (2006.01) |
| H03K 7/08 | (2006.01) |
| H03L 7/06 | (2006.01) |
| H04J 7/00 | (2006.01) |

(52) U.S. Cl. ....... 327/172; 327/176; 332/109; 363/21.1; 370/212; 375/238

(58) Field of Classification Search .......... 332/109–111; 327/156–159, 172–177; 331/45; 363/21.1, 363/41; 370/212; 375/238
See application file for complete search history.

(56) References Cited

U.S. PATENT DOCUMENTS

| | | | |
|---|---|---|---|
| 7,528,640 B2 * | 5/2009 | Huang et al. .................. 327/172 |
| 2004/0207466 A1 | 10/2004 | Anderson et al. |
| 2006/0214712 A1 | 9/2006 | O'Malley et al. |
| 2007/0176815 A1 | 8/2007 | Kost |
| 2008/0012647 A1 | 1/2008 | Risbo et al. |

OTHER PUBLICATIONS

U.S. International Searching Authority, International Search Report and Written Opinion for International Appln. No. PCT/US2009/062702, Feb. 26, 2010, 11 pages.

* cited by examiner

*Primary Examiner* — David Mis
(74) *Attorney, Agent, or Firm* — Fliesler Meyer LLP

(57) ABSTRACT

A multiple channel Digital Pulse Width Modulator (DPWM) can include a single delay locked loop with a delay line, the delay line producing a number of outputs. Circuitry can use a delay line mask to mask a portion of the delay line outputs to produce a modified outputs so as to prevent premature pulse width reset. Jitter tolerance look ahead circuits can prevent jitter from causing premature reset of pulse width modulated signals. The pulse width modulators can include multiple alternately used multiplexers so that the operation of the pulse width modulators is not affected by the load time of the multiplexers.

25 Claims, 8 Drawing Sheets

MULTI-CHANNEL DIGITAL PULSE WIDTH MODULATOR (DPWM)

CLAIM OF PRIORITY

This application claims priority from the following co-pending application, which is hereby incorporated in its entirety: U.S. Provisional Application No. 61/110,244 entitled: "MULTI-CHANNEL DIGITAL PULSE WIDTH MODULATOR (DPWM)", by Eric Iozsef, et al., filed Oct. 31, 2008.

BACKGROUND

The present invention relates to Digital Pulse Width Modulators (DPWM). Digital Pulse Width Modulators that have multiple channel outputs typically use a dedicated Delay Locked Loop (DLL) for each channel.

SUMMARY

A multiple channel Digital Pulse Width Modulator (DPWM) can include a single delay locked loop with a delay line, the delay line producing a number of outputs. Circuitry can use a delay line mask to mask a portion of the delay line outputs to produce a modified outputs so as to prevent premature pulse width reset. Jitter tolerance look ahead circuits can prevent jitter from causing premature reset of pulse width modulated signals. The pulse width modulators can include multiple alternately used multiplexers so that the operation of the pulse width modulators is not affected by the load time of the multiplexers. A single Delay Locked Loop (DLL) can be used to control the pulse width modulation of multiple channels regardless of whether the pulses of those channels are started in phase or out of phase by using jitter control circuitry.

DETAILED DESCRIPTION

Figure 1A:
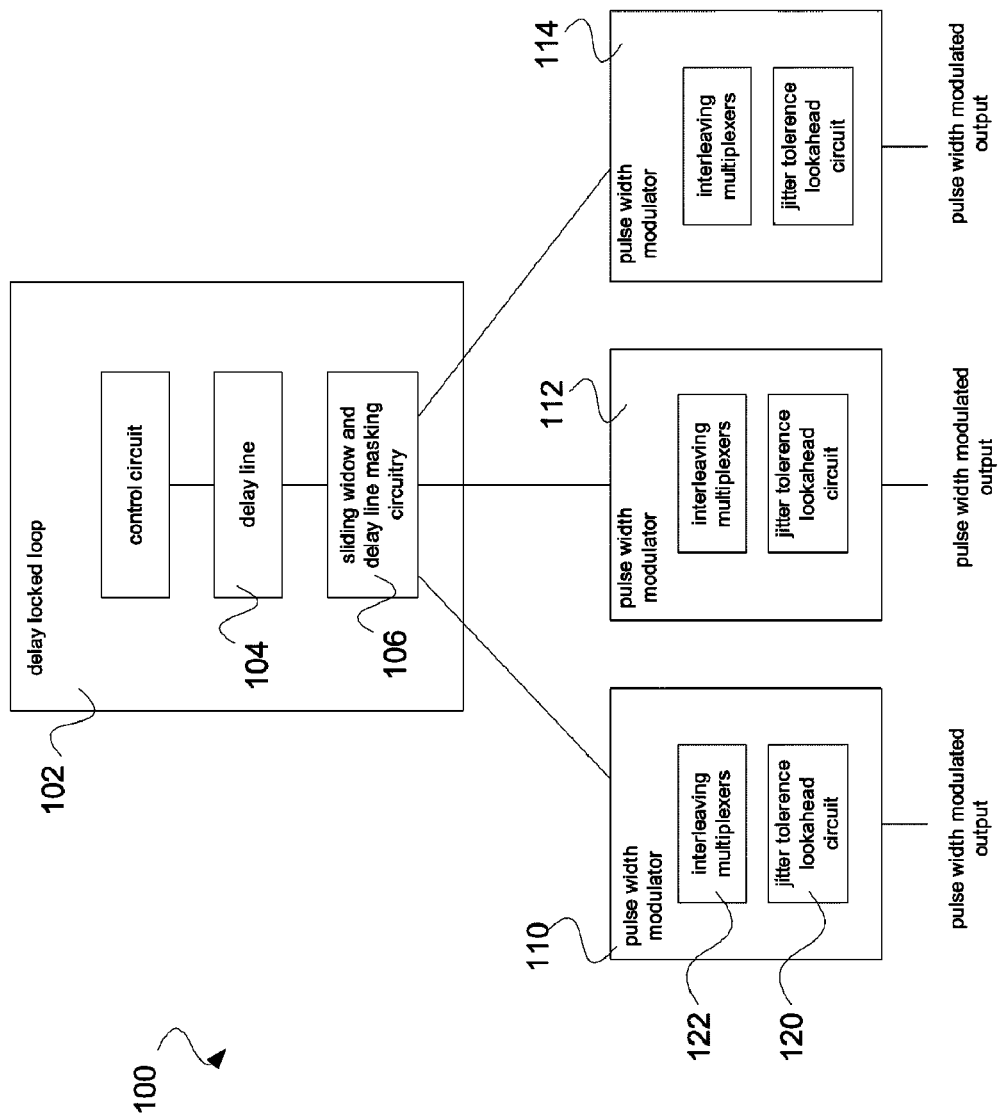
FIG. 1A shows an exemplary multichannel digital pulse width modulator (DPWM) of one embodiment.

FIG. 1A shows a multiple channel Digital Pulse Width Modulator (DPWM) 100. A single Delay Locked Loop (DLL) 102 has a delay line 104 that can produce a number of outputs. Circuitry 106 connected to at least some of the outputs of the of the delay line can use a delay line mask to mask a portion of the delay line outputs to produce a modified outputs so as to prevent premature pulse width reset.

Multiple pulse width modulators 110, 112 and 114 can receive the modified outputs from the circuitry 106. The multiple pulse width modulators 110, 112 and 114 can produce pulse width modulated signals.

The circuitry 106 can use AND elements to AND the portion of the delay line outputs with the delay line mask.

The masked outputs can be consecutive higher outputs of the delay line 104. The delay line mask can go low right before a first output of the delay line goes high so as to prevent the premature pulse reset.

The circuitry 106 can include a sliding window delay. The sliding window delay can be implemented by ANDing outputs of the delay line.

Figure 2:
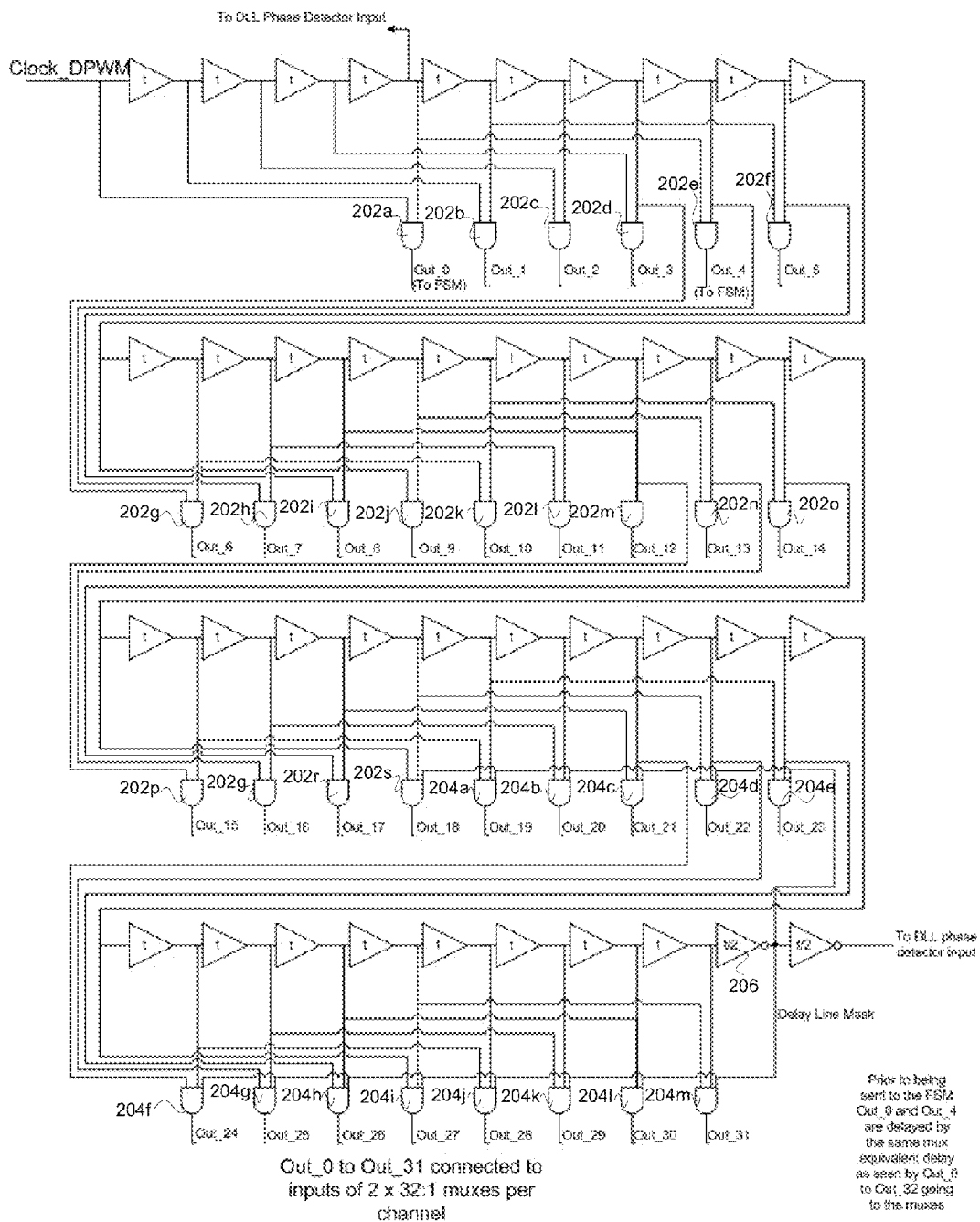
FIG. 2 shows a delay line with associated jitter control circuitry of one embodiment.

In one embodiment, as shown in FIG. 2, the circuitry includes ANDs wherein some of the ANDs 202a-202s have two delay line outputs as inputs and other ANDs 204a-202m have two delay line outputs and the delay line mask as inputs. The two delay line outputs provide for the sliding window delay. In the example of FIG. 2, the inverter 206 produces the delay line mask signal.

Figure 1B:
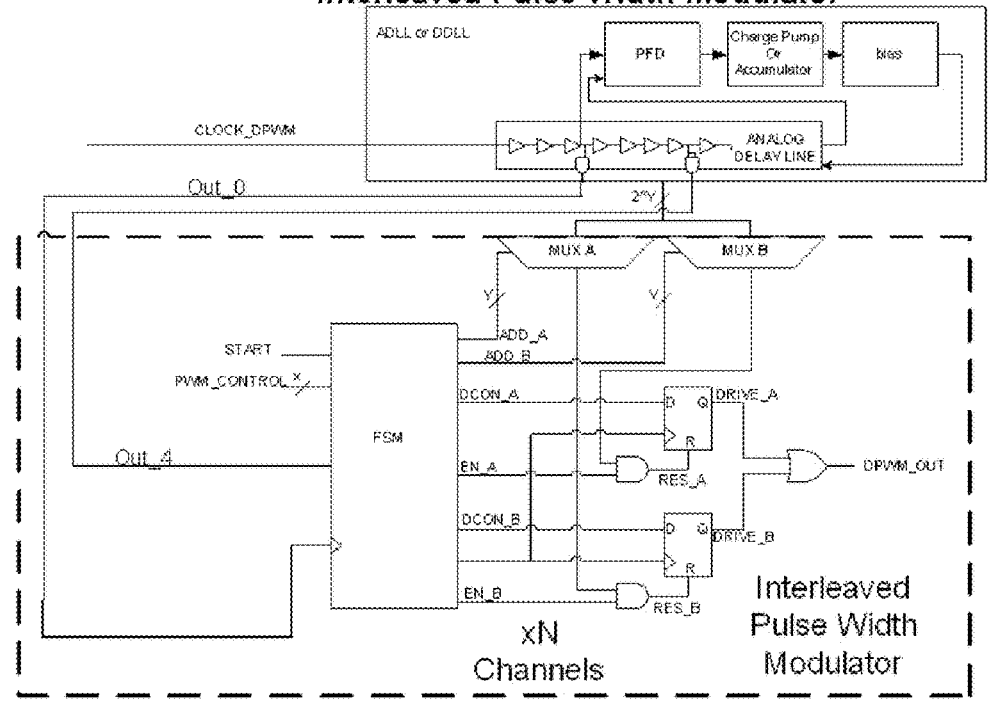
FIG. 1B shows a single delay locked loop (DLL) driving N pulse width modulators of one embodiment.
Figure 1B:
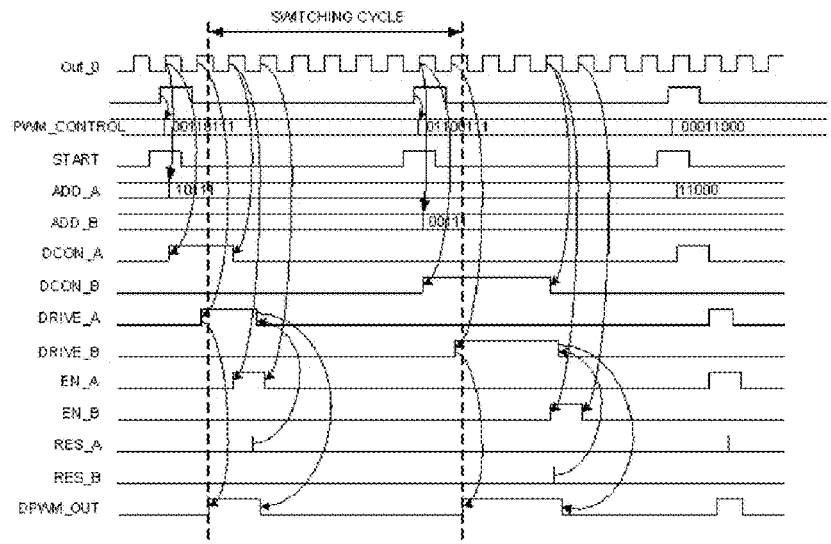

Looking again at FIG. 1, a pulse width modulator 110 can include a jitter tolerance look ahead circuit 120 to prevent jitter from causing premature reset of a pulse width modulated signal.

Figure 8:
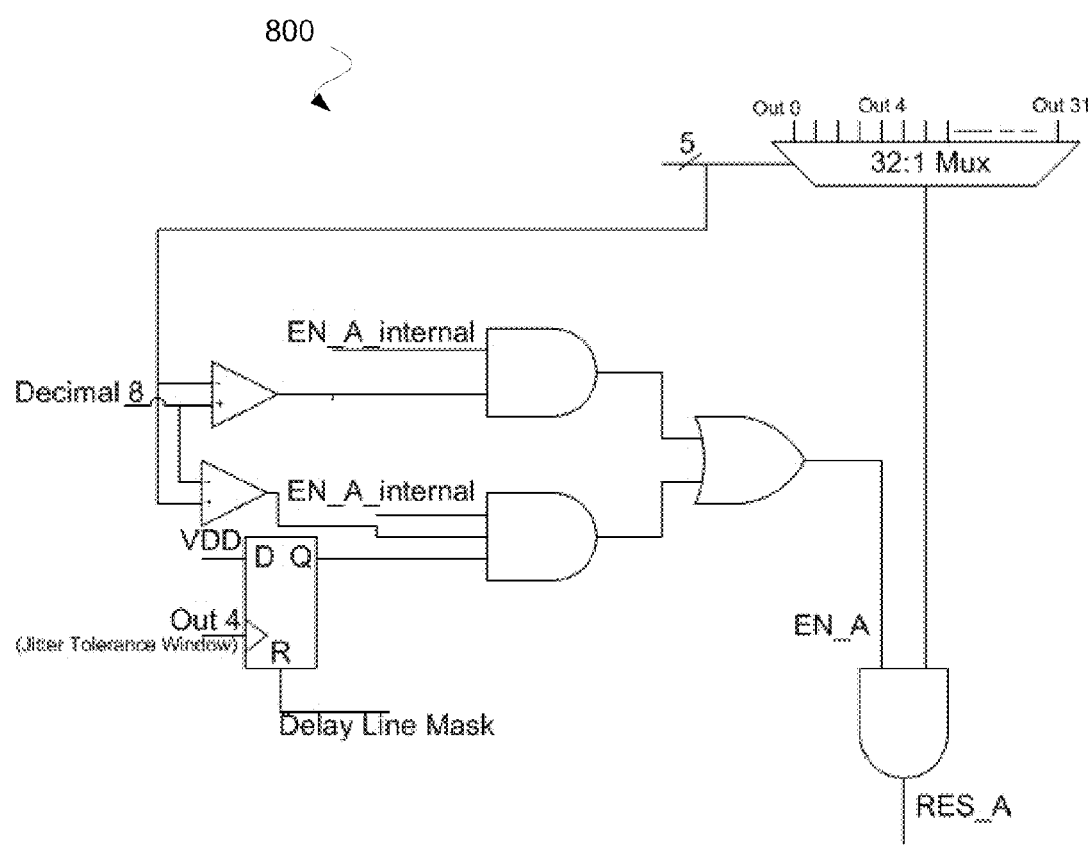
FIG. 8 shows an exemplary jitter tolerance window circuit of one embodiment.

As shown in FIG. 8, the jitter tolerance look ahead circuit 800 can include circuitry that tests whether a selected multiplexer address is above a certain value. If so, the jitter tolerance look ahead circuit can prevent any reset until a certain delay line output changes. The jitter tolerance look ahead circuit can use the delay line mask signal.

Looking again at FIG. 1, the pulse width modulator 110 can also include multiple alternately used multiplexers 122 so that the operation of the pulse width modulators is not affected by the load time of the multiplexers.

Embodiments of the present invention allow the use of a single DLL (analog or digital) to generate a multitude of pulse width modulated signals for a multitude of channels, all at the same frequency (or at frequencies related by a multiple of $2^n$). The start point of these pulses may be in phase or out of phase with respect to each other. Each pulse width modulated signal may have a different duty cycle determined by a digital control word. A very large duty cycle, >99% is also possible without a full clock delay FIG. 1B shows a single DLL driving N pulse width modulators.

The DLL can be either a traditional DLL with a charge pump and linear phase detector or it can be a digital DLL using a bang-bang phase detector and accumulator.

Each channel or pulse width modulator can be interleaved, meaning that each pulse width modulator effectively has two parallel paths that are each clocked on alternating input clock cycles (Out_0). The resultant outputs can be "OR-ed" together. This allows each path sufficient time to load in the y-bit word controlling the reset multiplexer, even in the case of very high duty cycle (>99%) pulse widths, where otherwise there would not be enough time between the falling edge of the previous pulse width modulated signal and the rising edge of the next pulse width modulated signal to ensure that the multiplexer was properly controlled and selecting the correct input.

In this manner two parallel paths for each channel ensure sufficient timing margin at the expense of extra circuitry, including an extra multiplexer per channel. If a very high duty cycle is not a requirement or is prevented by some other means, then the interleaving and the doubling of circuitry, such as the multiplexer, is not necessary.

A timing diagram is also shown in FIG. 1B. The interleaved operation for one channel is shown using the suffixes _A and _B to represent the two phases of each channel.

In this particular case, the switching cycle is composed of 8 Out_0 clock cycles. The FSM (Finite State Machine) effectively counts up to 8 clock cycles under the control of the signal PWM_CONTROL (x=3 bits in this particular case). This defines the starting point of DPWM_OUT, whereas the falling edge of DPWM_OUT is defined by DRIVE_A and DRIVE_B as a result of the resetting of the flip flop by the signals from MUX A and MUX B which tap the analog delay line that in turn is locked by the DLL to the incoming CLOCK_DPWM and which produces equally spaced rising edges within one CLOCK_DPWM cycle.

FIG. 2 shows an exemplary delay line. This particular configuration is shown with 32 outputs, numbered Out_0 to Out_31. Each delay is equal in time by virtue of matching and is shown to have delay time "t". This delay can be made variable by changing the current in the delay for example.

The "and" gates placed at the output of each delay tap serve two purposes. The first and most important purpose is to mask the outputs from Out_18 to Out_31. This is crucial to allowing a single DLL to drive multiple pulse width modulators without requiring a delay line and DLL for each and every channel.

Figure 3:
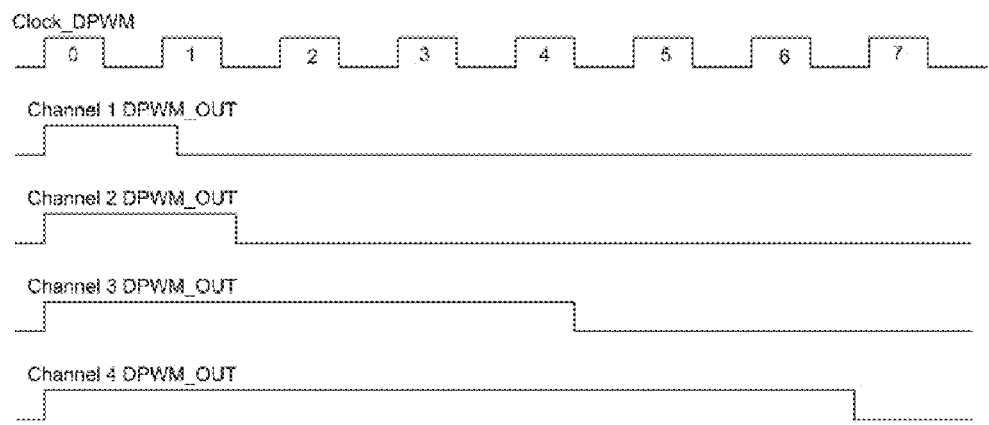
FIG. 3 and FIG. 4 show two different examples where four pulse width modulated signals are generated.
Figure 4:
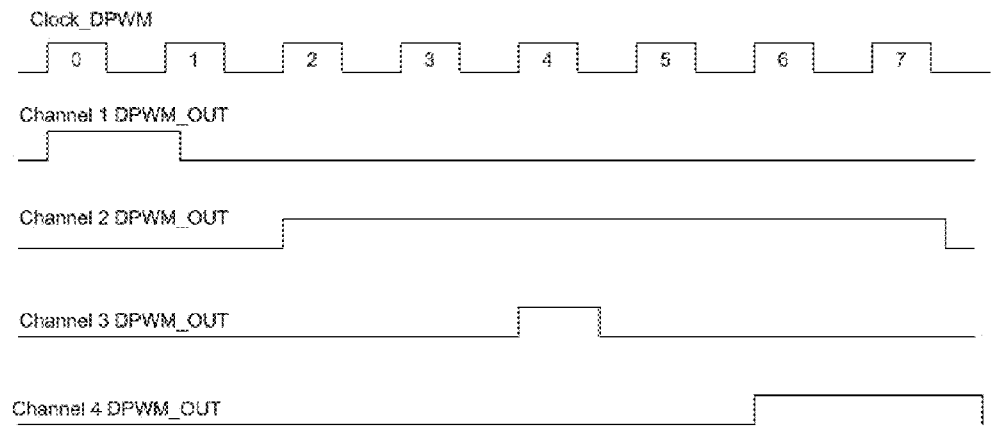

FIG. 3 and FIG. 4 show two different cases where 4 pulse width modulated signals are generated. FIG. 3 shows the 4 channels starting on the same clock edge but terminating during any of the 8 possible clock cycles (numbered 0-7) and defined by the DLL. Likewise FIG. 4 shows the 4 channels starting on the rising edge of different clock cycles but ending at different points in time. Clearly there is no specific relationship as to when the pulse width of one channel terminates relative to the pulse width of another channel. This implies that a continuous clock (Clock_DPWM) must be sent down the delay line since any channel could use any of the numbered clock cycles (numbered 0-7 in this case) as the cycle during which the clock propagating down the delay line resets the pulse width of that particular channel. For example Channel 1 could terminate during clock period 1 while Channel 2 terminates during clock period 2, Channel 3 during clock period 3 and so on. The more channels in the system the more likely this scenario and the more sense it makes to send a continuous clock waveform down the delay line. The continuous clock is what makes the N channels from one delay line/DLL possible.

Figure 5:
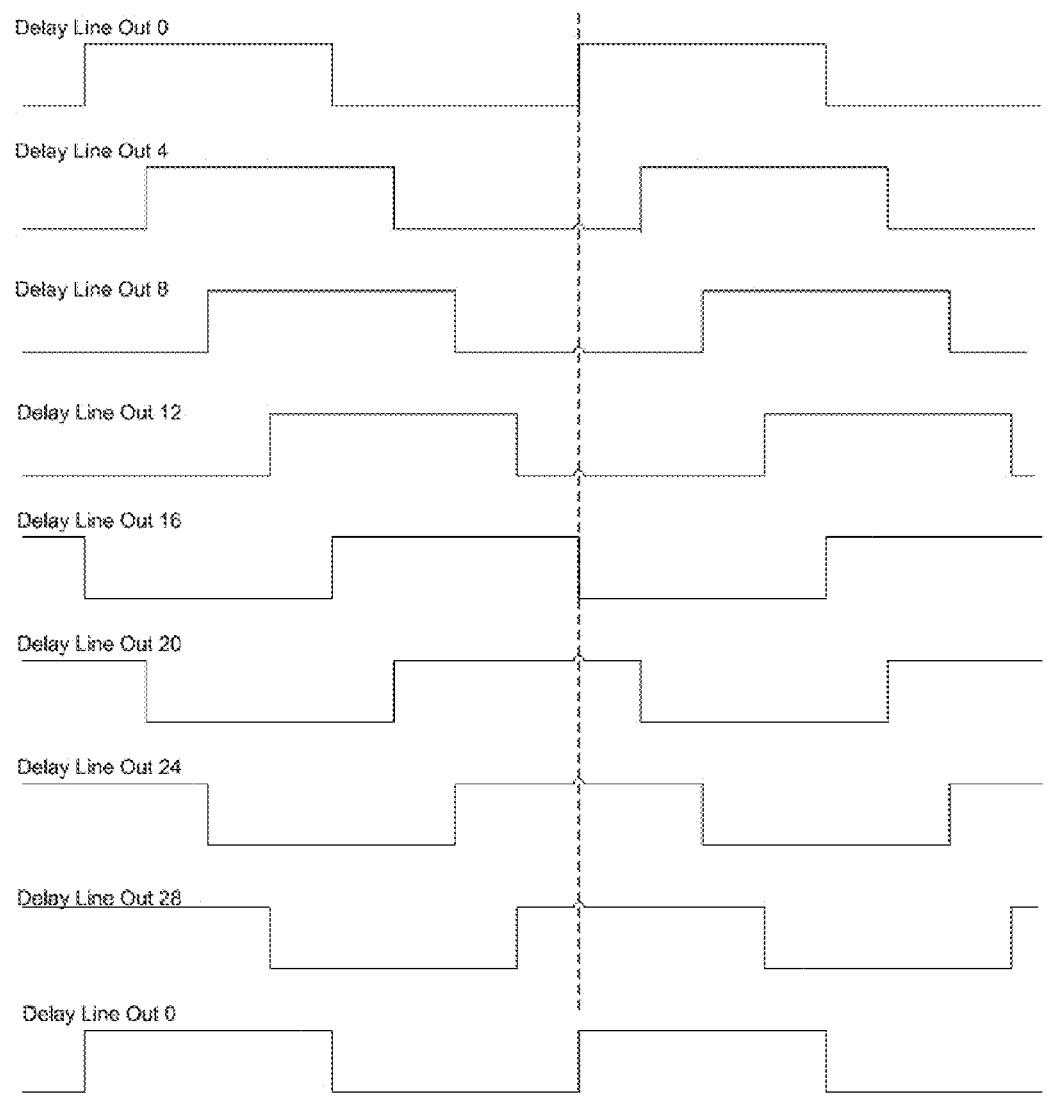
FIG. 5 illustrates a problem with a continuous clock.

FIG. 5 now starts to illustrate the problem with a continuous clock. It shows the output of several delay taps from a traditional delay line (when locked to the incoming clock-"Delay Line Out 0") which does not have the "and" gates shown in FIG. 2. In FIG. 5 observe the dotted vertical line. This represents a snapshot of all the delay line taps at one given moment in time, in this particular case at the point where the next incoming clock edge arrives, denoted by "Delay Line Out 0".

Note that at this point in time every delay line output from "Delay Line Out 16" through "Delay Line Out 31" (not all the tap outputs are shown due to space limitations on the page) is high. "Delay Line Out 0" is used to open up a reset window for a particular channel such that when this pulse propagates down the delay line it will reset the given channels pulse width low when it reaches the selected delay tap.

In the example in FIG. 5 assume that it is intended that "Delay Line Out 0" at the bottom of the page is to be used to reset the pulse width of a given channel when it reaches "Delay Line Out 24". However, at the point in time when "Delay Line Out 0" goes high "Delay Line Out 24" is still high from the previous clock cycle propagating through the delay line. This means that instead of waiting for the new "Delay Line Out 0" pulse to propagate through the delay line to the "Delay Line Out 24" position the pulse width of the given channel would go low immediately as "Delay Line Out 0" went high since at this point in time the reset window would open, selecting "Delay Line Out 24" through the multiplexer which in turn would reset the pulse width immediately since it was already high at the start of "Delay Line Out 0". In another words the pulse width of a given channel can end prematurely on the rising edge of "Delay Line Out 0" when the user in fact wants to reset on "Delay Line Out 16" through "Delay Line Out 31".

Having a clock pulse with a duty cycle much shorter than 50% would not help since as long as the clock pulse is at least as long as the duration of one tap in the delay line the same scenario could occur, just for fewer tap conditions.

Figure 6:
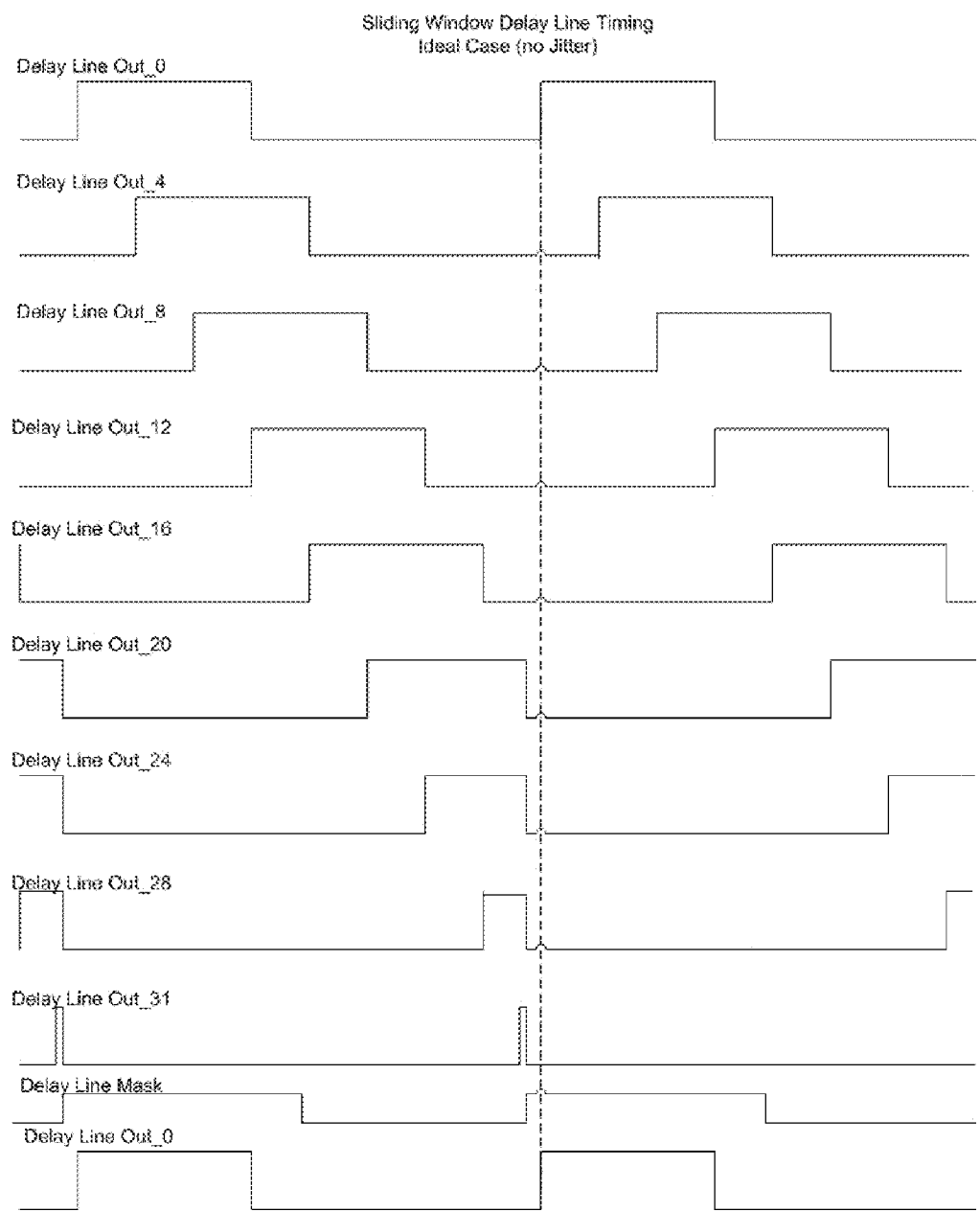
FIG. 6 shows the use of a "Delay Line Mask".

To alleviate the problem described above a "Delay Line Mask" is used as shown in FIG. 6. The "Delay Line Mask" basically masks the upper half of the delays in the delay line such that when "Delay Line Out 0" goes high "Delay Line Out 16" to "Delay Line Out 31" are all low. This means that a premature pulse width reset cannot occur when "Delay Line Out 0" goes high since none of the other "Delay Line Out X" are high at that moment in time. Note that the delay line itself still has half of its delay tap outputs high and half low at any point in time. However, AFTER the "and" gates it appears as if the delay line is all 0's as the Clock_DPWM starts to propagate through the delay line. The "Delay Line Mask" generation is shown in FIG. 2 where the mask is generated via an inverted (½*t) delay after the 31$^{st}$ delay in the delay line. This ensures that all delay edges are monotonically generated through the "and" gates prior to "masking" the upper half of the delay line. Note that the reset pulses from "Delay Line Out X" become progressively shorter in the upper half of the delay range since all pulses now end on the rising edge of "Delay Line Mask". Therefore if you look at the vertical dotted line in FIG. 6 you will note that as the next "Delay Line Out 0" clock is generated at the bottom of the page that all the other "Delay Line Out X" outputs are 0 at that point in time preventing any premature termination of the pulse width modulated signal.

In FIG. 6 "Delay Line Out X" is equivalent to "Out X" in FIG. 2. In another words, both represent the output of the "and" gates.

The second reason for using "and" gates is to create a sliding window. Each delay line element output is "and-ed" with the output of the delay line element four positions earlier in the chain. The purpose of this is to deal with non 50% duty cycle Clock_DPWM incoming to the delay line. In order to ensure that all the "Delay Line Out X" elements ("and" gates) are 0 prior to the next rising edge of Clock_DPWM enters the delay line, even when the duty cycle is >50%, it is necessary to perform this operation. This ensures that even a 60% duty cycle clock cannot falsely or prematurely trigger the end of the pulse width.

Although the "Delay Line Mask" is effective in preventing premature reset of the pulse width modulated signal when the input CLK_DPWM signal is clean (i.e. no jitter) it is not sufficient on its own in the presence of jitter, especially at higher frequencies where the jitter may be larger than (½*t) delay and where the mismatch in delay to delay may also eat into the (½*t) margin. In this case premature resetting of the pulse width may still occur.

In order to deal with this situation a jitter tolerance circuit is used. One possible implementation of this circuit is shown in FIG. 8 whereas the impact of the circuit is shown in FIG. 7.

Figure 7:
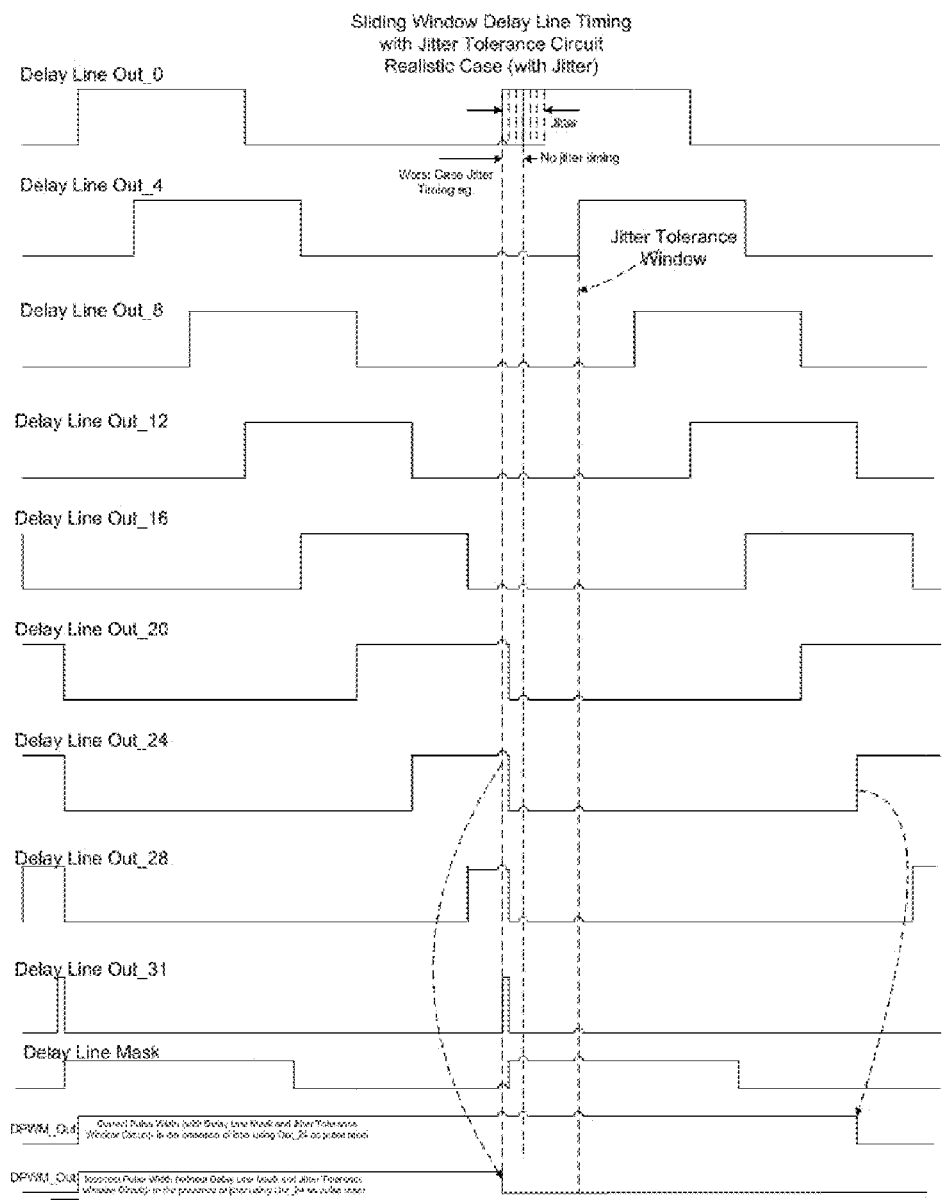
FIG. 7 shows the timing both without jitter and with jitter present for the circuit of FIG. 6.

FIG. 7 shows the timing both without jitter and with jitter present. For the sake of the example only the jitter on the rising edge of "Delay Line Out 0" is shown.

Despite the presence of the "Delay Line Mask" and its associated timing one can observe that if the next rising edge of the signal "Delay Line Out 0" arrives earlier than expected due to excessive cycle to cycle jitter (>½*t) that one or more of the outputs of the "and" gates in the upper half of the delay line may still be high again resulting in premature termination of the pulse width at the rising edge of the signal "Delay Line Out 0".

This effect is shown as the signal DPWM_Out (last signal at the bottom in FIG. 7).

The correct or intended pulse width is shown as DPWM_Out (second signal from the bottom in FIG. 7). In order to achieve the correct pulse width in the jitter condition we increase the jitter tolerance by employing a look ahead circuit. This circuit compares the intended address for the multiplexer selection for the resetting of the pulse width with the decimal value of 8. If the address is less than 8 then no change is affected since we know that the lower half of "Delay Line Out X" is already naturally low, under locked conditions, when "Delay Line Out 0" goes high. We just wait for this signal to propagate naturally to generate the correct reset.

If the address value is greater than decimal 8 then we employ a second mask (or jitter tolerance window) by waiting for the output "Delay Line Out 4" to go high before allowing a reset of the pulse width to occur when the appropriate or selected "Delay Line Out X" goes high. This technique in effect opens the reset window later based on the knowledge that the desired pulse width reset position occurs later in time. By employing "Delay Line Out 4" as the signal for the masking we ensure that we can tolerate up to (4*t) cycle to cycle jitter without incorrectly resetting the pulse width. Even if "Delay Line Out 0" arrives early by up to 4*t, due to jitter, we know that the "Delay Line Mask" signal will "clear" the upper half of the delay line eventually. If this occurs within 4*t then by the time "Delay Line Out 4" goes high the upper half of the delay line "and" gate outputs will be 0 and the pulse width reset choice will be valid again.

FIG. 8 shows a circuit that achieves this desired goal. It is not the only possible implementation to achieve this result.

The choice of "Delay Line Out 4" as the jitter tolerance mask signal of choice is also somewhat arbitrary and up to the user based on their knowledge of the amount of jitter possible in their system. Using a very low value of "Delay Line Out X" as the jitter tolerance mask signal may result in an insufficient amount of jitter tolerance. Using a value of "Delay Line Out X" beyond the mid-point of the delay line does not make sense since desired pulse width reset values around the mid-point would then also be left vulnerable as they may be high when "Delay Line Out 0" goes high prematurely due to jitter. Therefore the threshold for the jitter tolerance mask should be somewhere between "Delay Line Out 0" and "Delay Line Out ½max".

The jitter tolerance look ahead circuit/mask is useful in addition to the original "Delay Line Mask". Having the jitter tolerance look ahead mask on its own would not be sufficient either since it would just move the premature pulse width reset from the position of "Delay Line Out 0" to the position of "Delay Line Out 4" in this particular example. Without the "Delay Line Mask" there would always be some "Delay Line Out X" in the upper half of the delay line being high and capable of prematurely resetting the modulated pulse width at the instant that the jitter tolerance mask pulse goes high.

The invention can be used in any application where there is a requirement to generate a multitude of digital pulse width modulated signals, all at the same frequency or at frequencies related by a multiple of $2^n$, but with each signal being uniquely pulse width modulated based on an external control mechanism (eg. Digital word). Such applications include, but are not limited to, DPWM's for digital power controllers.

The system can include:
1. Masked Sliding Window DLL that allows a single rising edge (i.e. pulse width modulation reset pulse) to be present at the output of the delay line delays in the presence of a continuous 50% or non-50% duty cycle clock at the input.
2. Interleaving FSM (Finite State Machine) that allows for defining and executing pulse width modulation with duty cycles ranging from 0-100%.
3. High Input Jitter Tolerance look ahead circuit that prevents any errors in the pulse width Modulation under noisy or high clock jitter conditions. This is especially important at high frequencies.

Embodiments of the present invention can result in chip area and power savings due to the use of a single DLL.

The foregoing description of preferred embodiments of the present invention has been provided for the purposes of illustration and description. It is not intended to be exhaustive or to limit the invention to the precise forms disclosed. Many embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the claims and their equivalents.

The invention claimed is:

1. A multiple channel Digital Pulse Width Modulator (DPWM) comprising:
    a single delay locked loop with a delay line, the delay line producing a number of outputs;
    circuitry connected to at least some of the outputs of the of the delay line to use a delay line mask to mask a portion of the delay line outputs to produce modified outputs so as to prevent premature pulse width reset; and
    multiple pulse width modulators receiving the modified outputs from the circuitry, the multiple pulse width modulators producing pulse width modulated signals.

2. The multiple channel DPWM of claim 1, wherein the circuitry uses AND elements to AND the portion of the delay line outputs with the delay line mask.

3. The multiple channel DPWM of claim 1, wherein the portion of the delay outputs are consecutive higher outputs of the delay line.

4. The multiple channel DPWM of claim 1, wherein the delay line mask goes low right before a first output of the delay line goes high.

5. The multiple channel DPWM of claim 1, wherein the circuitry includes a sliding window delay.

6. The multiple channel DPWM of claim 5, wherein the sliding window delay is implemented by ANDing outputs of the delay line.

7. The multiple channel DPWM of claim 5, wherein the sliding window delay compensates for a greater than 50% duty cycle clock signal in the delay line.

8. The multiple channel DPWM of claim 1, wherein the circuitry includes ANDs wherein some of the ANDs have two delay line outputs as inputs and other ANDs have two delay line outputs and the delay line mask as inputs.

9. The multiple channel DPWM of claim 1, wherein the pulse width modulators include jitter tolerance look ahead circuits to prevent jitter from causing premature reset of a pulse width modulated signal.

10. The multiple channel DPWM of claim 9, wherein the jitter tolerance look ahead circuits include circuitry that tests whether a selected multiplexer address is above a certain value, if so, the jitter tolerance look ahead circuit prevents any reset until a certain delay line output changes.

11. The multiple channel DPWM of claim 10, wherein the jitter tolerance look ahead circuits use a delay line mask.

12. The multiple channel DPWM of claim 1, wherein the pulse width modulators include multiple alternately used multiplexers so that the operation of the pulse width modulators is not affected by the load time of the multiplexers.

13. A multiple channel Digital Pulse Width Modulator (DPWM) comprising:
a single delay locked loop with a delay line; and
multiple pulse width modulators operably connected to the delay locked loop, the multiple pulse width modulators producing pulse width modulated signals, wherein the pulse width modulators include jitter tolerance look ahead circuits to prevent jitter from causing premature reset of a pulse width modulated signal.

14. The multiple channel DPWM of claim 13, wherein the jitter tolerance look ahead circuits include circuitry that tests whether a selected multiplexer address is above a certain value, if so, the jitter tolerance look ahead circuit prevents any reset until a certain delay line output changes.

15. The multiple channel DPWM of claim 14, wherein the certain delay line output change is the change of a specific modified delay line output.

16. The multiple channel DPWM of claim 13, wherein the jitter tolerance look ahead circuits use a delay line mask.

17. The multiple channel DPWM of claim 13, further comprising circuitry connected to at least some outputs of the of the delay line to use a delay line mask to mask a portion of the delay line outputs to produce a modified outputs so as to prevent premature pulse width reset, the modified outputs being provided to the multiple pulse width modulators.

18. The multiple channel DPWM of claim 17, wherein the circuitry includes ANDs wherein some of the ANDs have two delay line outputs as inputs and other ANDs have two delay line outputs and the delay line mask as inputs.

19. The multiple channel DPWM of claim 17, wherein at least one of the multiple modified outputs are provided to the jitter tolerance look ahead circuit.

20. The multiple channel DPWM of claim 13, wherein the pulse width modulators include multiple alternately used multiplexers so that the operation of the pulse width modulators is not affected by the load time of the multiplexers.

21. A multiple channel Digital Pulse Width Modulator (DPWM) comprising:
a single delay locked loop with a delay line, the delay line producing a number of outputs;
circuitry connected to at least some of the outputs of the of the delay line to produce modified outputs, the modified outputs compensating for a greater than 50% duty cycle clock signal in the delay line; and
multiple pulse width modulators receiving the modified outputs from the circuitry, the multiple pulse width modulators producing pulse width modulated signals.

22. The multiple channel DPWM of claim 21, wherein the circuitry compensation comprises a sliding window delay.

23. The multiple channel DPWM of claim 22, wherein the sliding window delay is implemented by ANDing outputs of the delay line.

24. The multiple channel DPWM of claim 21, wherein the circuitry includes ANDs wherein some of the ANDs have two delay line outputs as inputs and other ANDs have two delay line outputs and a delay line mask as inputs.

25. A multiple channel Digital Pulse Width Modulator (DPWM) comprising:
a single delay locked loop with a delay line; and
multiple pulse width modulators operably connected to the delay locked loop, the multiple pulse width modulators producing pulse width modulated signals, wherein the pulse width modulators include multiple alternately used multiplexers so that the operation of the pulse width modulators is not affected by the load time of the multiplexers.

* * * * *